(12) United States Patent
Feenan et al.

(10) Patent No.: US 6,940,281 B2
(45) Date of Patent: Sep. 6, 2005

(54) GRADIENT COIL APPARATUS AND METHOD OF ASSEMBLY THEREOF

(75) Inventors: Peter John Feenan, Freeland (GB); Christopher John Evans, Haddenham (GB); Anthony Langtry, Oxford (GB); Christopher Mark Cirel, Oxford (GB)

(73) Assignee: GE Medical Systems Global Technology Company LLC, Waukesha, WI (US)

( * ) Notice: Subject to any disclaimer, the term of this patent is extended or adjusted under 35 U.S.C. 154(b) by 10 days.

(21) Appl. No.: 10/707,886

(22) Filed: Jan. 21, 2004

(65) Prior Publication Data

US 2005/0134269 A1    Jun. 23, 2005

(30) Foreign Application Priority Data

Dec. 22, 2003  (GB)  .................................. 0329669

(51) Int. Cl.$^7$ ............................................. G01V 3/00
(52) U.S. Cl. ...................................... 324/318; 324/309
(58) Field of Search .............................. 324/318, 319, 324/309, 307; 600/422, 410

(56) References Cited

U.S. PATENT DOCUMENTS

| | | | |
|---|---|---|---|
| 4,755,754 A * | 7/1988 | Sireul et al. | 324/318 |
| 5,235,283 A | 8/1993 | Lehne et al. | 324/318 |
| 5,537,039 A | 7/1996 | Le Roux et al. | |
| 5,570,021 A | 10/1996 | Dachniwskyj et al. | 324/318 |
| 5,630,415 A | 5/1997 | Kaufman | 128/653.2 |
| 6,075,363 A | 6/2000 | Sellers et al. | 324/318 |
| 6,198,961 B1 * | 3/2001 | Stern et al. | 600/422 |
| 6,441,616 B1 * | 8/2002 | Mansfield | 324/318 |
| 6,825,665 B2 * | 11/2004 | Eberler et al. | 324/318 |

FOREIGN PATENT DOCUMENTS

EP    0928480    7/2002

\* cited by examiner

Primary Examiner—Brij B. Shrivastav
(74) Attorney, Agent, or Firm—Cantor Colburn LLP (57) ABSTRACT

A gradient coil assembly and a method for manufacturing the gradient coil assembly is provided. The gradient coil assembly includes a first tube extending along an axis including a first conductor. The assembly further includes a second tube disposed generally concentrically about the first tube wherein an inner space is defined between the first and second tubes. The second tube includes a second conductor. Finally, the assembly includes a fiber composite structure disposed in the inner space operatively associated with the first and second tubes to increase a stiffness of the assembly.

21 Claims, 8 Drawing Sheets

GRADIENT COIL APPARATUS AND METHOD OF ASSEMBLY THEREOF

CROSS REFERENCE TO RELATED APPLICATIONS

This application claims the benefit of a priority under 35 U.S.C. 119 to Great Britain Patent Application No. 0329669.6 filed Dec. 22, 2003, the entire contents of which are hereby incorporated by reference.

BACKGROUND OF INVENTION

The invention relates to a gradient coil assembly utilized in a Magnetic Resonance Imagining (MRI) machine and a method for assembling the gradient coil assembly.

MRI machines utilize gradient coils to generate magnetic field gradients along three desired orthogonal axes. The gradient coils, however, undergo significant Lorentz forces during coil energization that can cause the coils to vibrate and generate undesirable noise and image degradation. The inventors herein have recognized that there is a need for a gradient coil assembly that is stiffer than other gradient coil assemblies, which can reduce coil vibrations and thus undesirable noise and image degradation.

SUMMARY OF INVENTION

The foregoing problems and disadvantages are overcome by a gradient coil assembly and method for manufacturing assembly in accordance with the exemplary embodiments disclosed herein.

A gradient coil assembly in accordance with exemplary embodiments includes a first tube extending along an axis including a first conductor. The gradient coil assembly further includes a second tube disposed generally concentrically about the first tube wherein an inner space is defined between the first and second tubes. The second tube includes a second conductor. Finally, the assembly includes a fiber composite structure disposed in the inner space operatively associated with the first and second tubes to increase a stiffness of the assembly.

A method for assembling a gradient coil assembly for use in an MRI device in accordance with exemplary embodiments is provided. The method includes disposing a first gradient tube generally concentrically about a second gradient tube wherein an inner space is defined between the first and second gradient tubes. The method further includes disposing a fiber composite structure in the inner space defined by the first and second gradient tubes.

Other systems and/or methods according to the embodiments will be or become apparent to one with skill in the art upon review of the following drawings and detailed description. It is intended that at all such additional systems, methods, and/or computer program products be within the scope of the present invention, and be protected by the accompanying claims.

BRIEF DESCRIPTION OF DRAWINGS

FIGS. 11-1 and 11-2 are a flowchart of a method of assembling the first embodiment of the gradient coil assembly.

DETAILED DESCRIPTION

Figure 1:
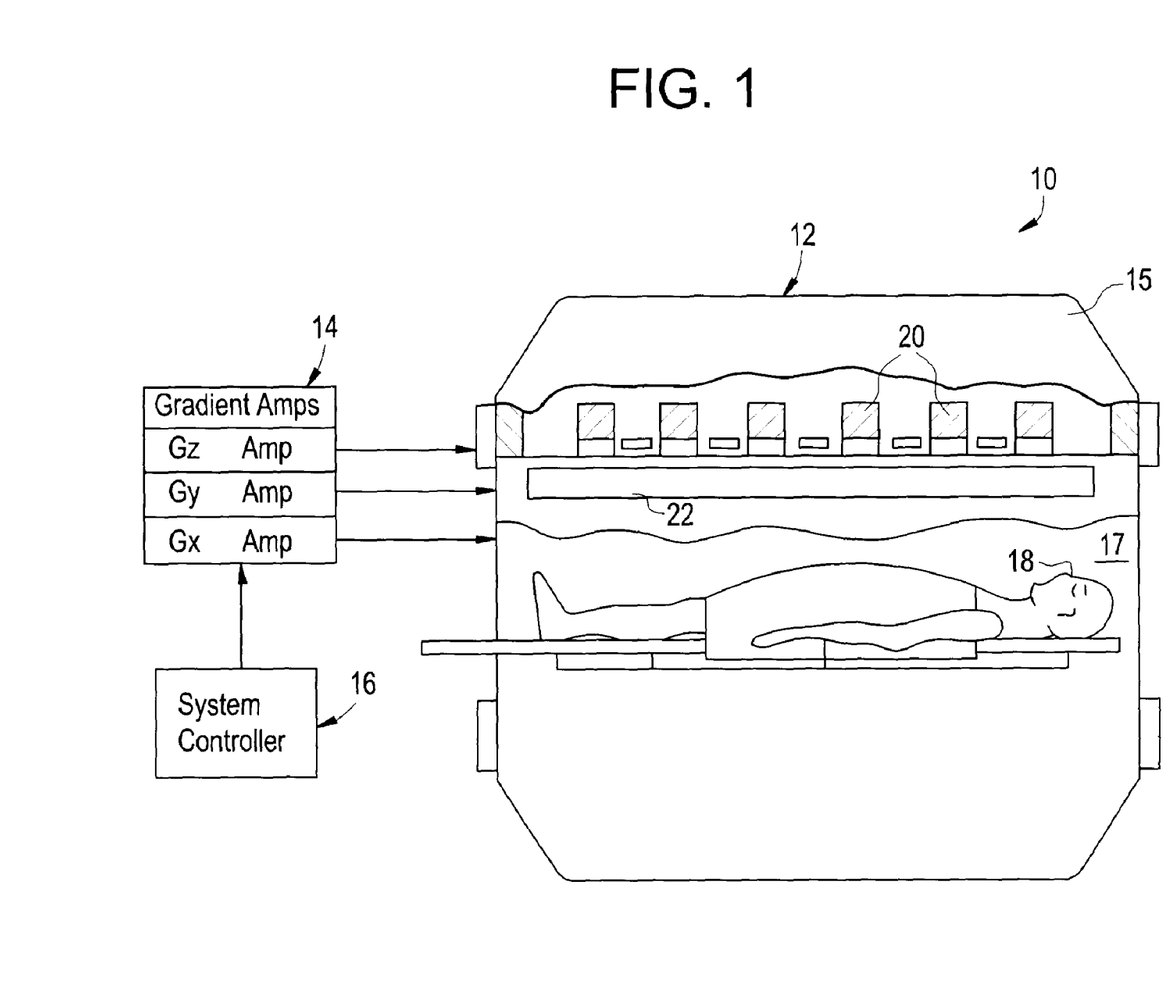
FIG. 1 is a block diagram of an MRI imaging system.

Referring to the drawings, identical reference numerals represent identical components in the various views. Referring to FIG. 1, an exemplary MRI system 10 is provided for generating images of a person 18. MRI system 10 may comprise a magnetic assembly 12, a gradient amplifier unit 14, and a system controller 16.

Magnetic assembly 12 is provided to generate magnetic fields that will be propagated to person 18. Assembly 12 may comprise a housing 15 defining a chamber 17 for receiving person 18. Assembly 12 may further comprise polarizing magnets 20, and a gradient coil assembly having (X) coils, (Y) coils, and (Z) coils. Gradient coil assembly 22 generate magnetic fields in response to signals received from the (Gz) amplifier, (Gy) amplifier, and (Gz) amplifier, respectively, contained in gradient amplifier unit 14.

Controller 16 is provided to generate control signals for controlling the gradient amplifier unit 14. In particular, controller 16 may generate control signals that induce gradient amplifier unit 14 to energize gradient coil assembly 22.

Figure 2:
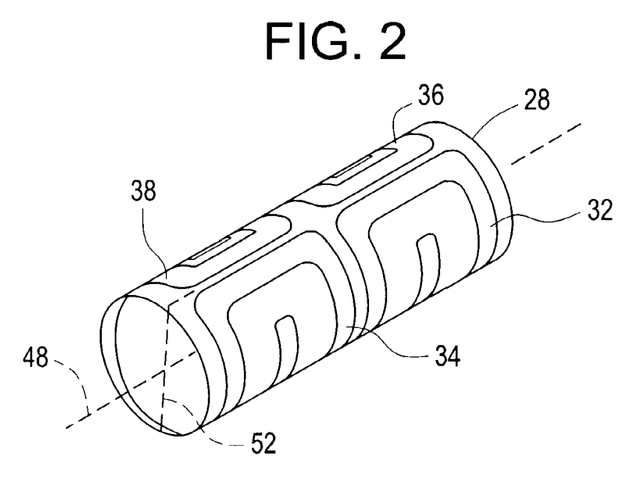
FIG. 2 is a schematic of an outer gradient tube.
Figure 3:
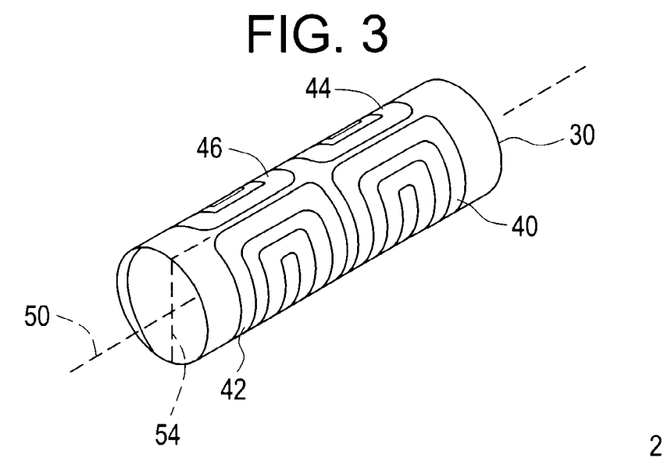
FIG. 3 is a schematic of an inner gradient tube.
Figure 4:
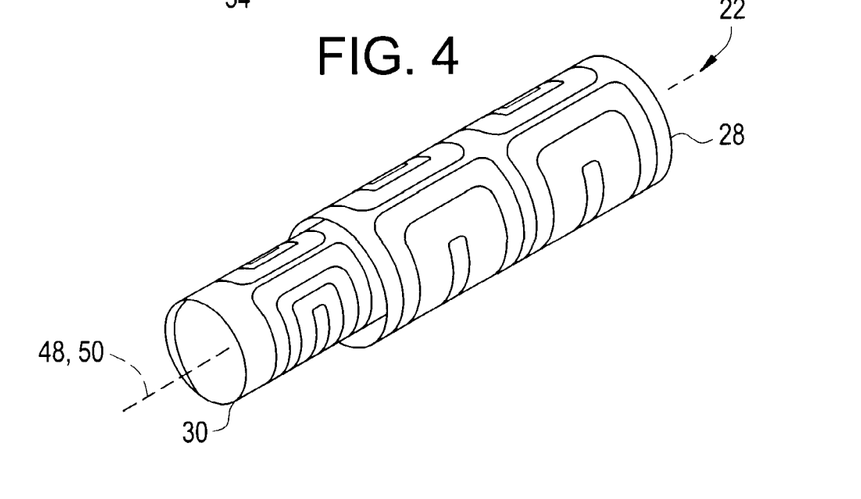
FIG. 4 is a schematic illustrating an inner gradient tube being disposed within an outer gradient tube.

Referring to FIGS. 2–4, a brief discussion of the inner gradient tube 30 and an outer gradient tube 28 utilized in gradient coil assembly 22 will be discussed. Outer gradient tube 28 is provided to hold the remainder of the gradient coil assembly components therein. Gradient tube 28 may be constructed from a fiber composite material comprising one or more layers wherein each layer comprises a plurality of fibers such as glass fibers, carbon fibers, Kevlar fibers, and aluminum oxide fibers, for example, coated with the epoxy resin. Gradient tube 28 may further include saddle coils 32, 34, 36, 38 disposed on an exterior surface of tube 28. Saddle coils 32, 34, 36, 38 may be constructed from copper conductors and are provided to generate a magnetic field. Saddle coils 32, 34, 36, 38 are electrically connected either in series or in parallel to each other. Coils 32, 34, 36, 38 may be adhesively applied to tube 28 with adhesives such as epoxy resin. As shown tube 28 is disposed about an axis 48 and includes a centerline 52 that extends through tube 28.

Inner gradient tube 30 is disposed within outer gradient tube 28. Gradient tube 30 may be constructed from a fiber composite material comprising one or more layers wherein each layer comprises a plurality of fibers such as glass fibers, carbon fibers, Kevlar fibers, and aluminum oxide fibers, for example, coated with the epoxy resin. Gradient tube 30 may further include saddle coils 40, 42, 44, 46 constructed from one or more copper conductors that are disposed on the exterior surface of tube 30. Saddle coils 40, 42, 44, 46 are provided to generate a magnetic field and are electrically coupled together. Saddle coils 40, 42, 44, 46 may be adhesively applied to tube 30 with adhesives such as epoxy resin for example. As shown tube 30, is disposed about an axis 50 and includes a centerline 54 that extends through tube 30.

It should be noted that the combination of saddle coils 32, 34, 36, 38 and saddle coils 40, 42, 44, 46 comprise an (X) coil. Further, although magnetic assembly 12 includes a (Y) coil and a (Z) coil, the (Y) and (Z) coils will not be discussed in any further detail for purposes of simplicity.

Referring to FIG. 4, inner gradient tube 30 may be disposed within outer gradient tube 28. Further, the axes 48, 50 are preferably coincident with one another after final assembly thereof. Further, centerlines 52, 54 are preferably coincident with one another after final assembly thereof.

Figure 5:
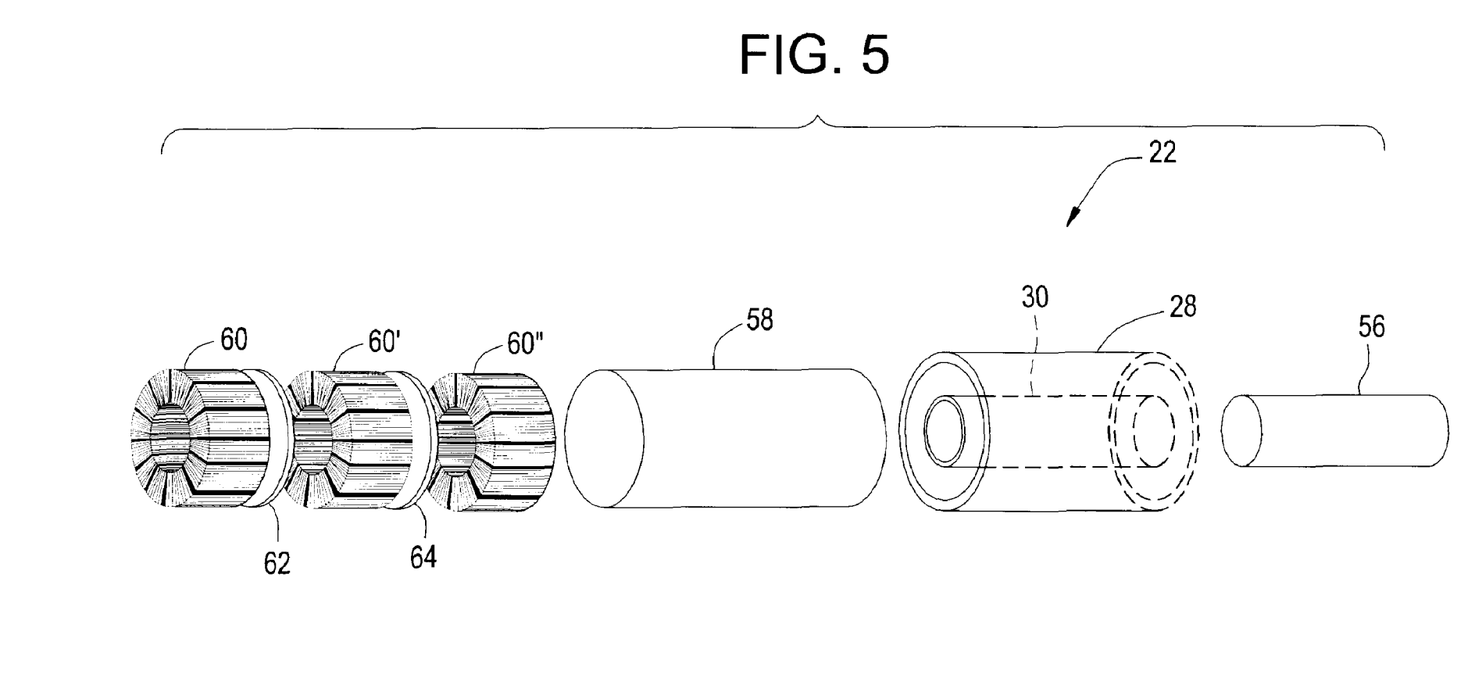
FIG. 5 is an exploded view of a first embodiment of a gradient coil assembly.

Referring to FIG. 5A, an exploded view of a gradient coil assembly 22 in accordance with the first embodiment of the present invention is provided. Gradient coil assembly 22 may include outer gradient tube 28, inner gradient tube 30, a viscoelastic sheet 56, a viscoelastic sheet 58, and tubular fin assemblies 60, 60', 60".

Viscoelastic sheet 56 is provided to dampen vibrations within assembly 22 during energization of the saddle coils in assembly 22. Viscoelastic sheet 56 may be wrapped around inner gradient tube 30. Sheet 56 may be constructed from a plurality of materials including rubber composites.

Viscoelastic sheet 58 is provided to dampen vibrations within assembly 22 during energization of the saddle coils in assembly 22. Viscoelastic sheet 58 may be wrapped around an inner surface of outer gradient tube 28. Sheet 58 may be constructed from a plurality of materials including rubber composites for example.

Figure 6:
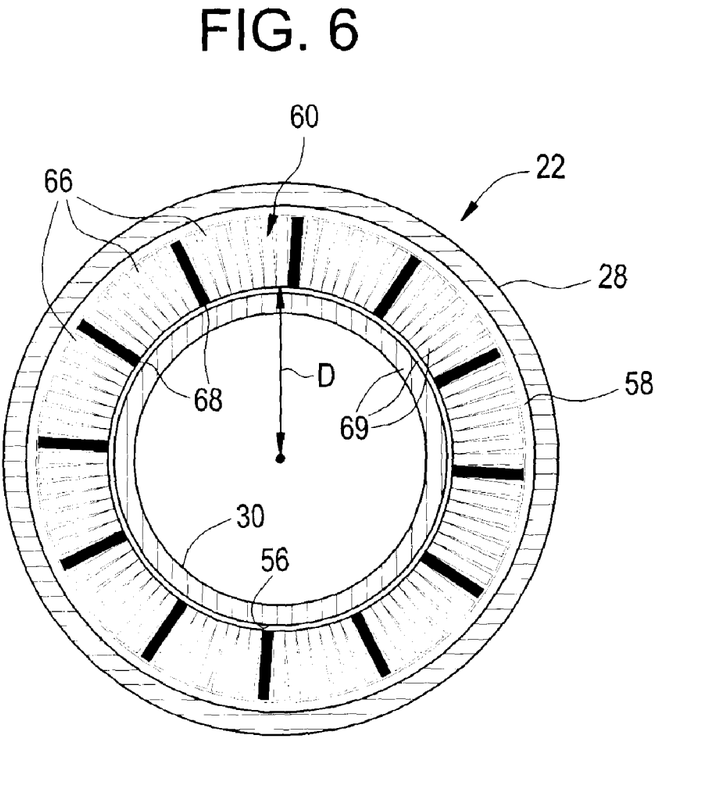
FIG. 6 is a cross-sectional view of the first embodiment of a gradient coil assembly.
Figure 7:
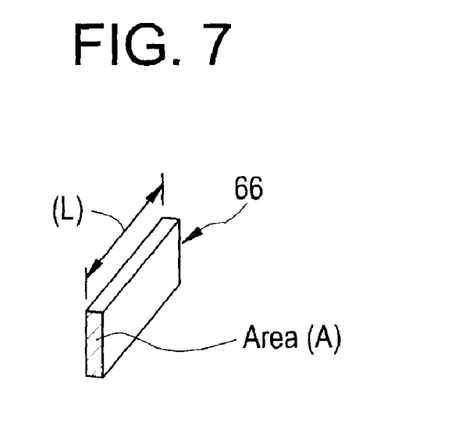
FIG. 7 is a schematic of a fiber composite fin.

Referring to FIG. 6, the configuration of tubular fin assembly 60 will now explained. Tubular fin assembly 60 may comprise a plurality of fins 66 disposed circumferentially about a diameter (D). The diameter (D) being at least as large as the diameter of inner gradient tube 30. Fins 66 are provided to stiffen assembly 22 to reduce vibrations during energization of the saddle coils of assembly 22. Each of the fins 66 may have a rectangular cross-sectional area (A) and may have a substantially similar length (L). It should be noted that fins 66 could be constructed using other cross-sectional geometries. Further, each of fins 66 may be constructed from a fiber composite material comprising one or more layers wherein each layer comprises a plurality of fibers such as glass fibers, carbon fibers, Kevlar fibers, and aluminum oxide fibers, for example, coated with the epoxy resin. The fiber direction within each fin 66 can be chosen to be parallel to axis 48 of assembly 22, or perpendicular to axis 48, or at a predetermined angle relative to axis 48. The direction of the fibers and the number of fibers may be varied based upon desired vibration characteristics of assembly 22. Further, the fiber to resin ratio in fins 66 may be equal to or greater than 90%.

As shown, tubular fin assembly 60 may further include a plurality of viscoelastic fins 68 intermittently disposed between one or more fins 66. Viscoelastic fins 68 are provided to dampen vibrations in assembly 22 during energization of the saddle coils in assembly 22. Viscoelastic fins 68 may be constructed from a plurality of materials including rubber composites. It should be noted that the number of fins 66 and fins 68 may vary depending upon the desired operational characteristics of assembly 22. Further, the cross-sectional shape of fins 66, 68 may vary depending upon the desired operating characteristics of assembly 22. For example, fins 66, 68 could be substantially wedge shaped. Tubular fin assemblies 60' and 60" may have a substantially similar configuration as assembly 60.

Referring to FIG. 5A, tubular viscoelastic sheets 62, 64 may be provided to dampen vibrations in gradient coil assembly 22 during energization of saddle coils in assembly 22. As shown, tubular viscoelastic sheet 62 may be disposed between assemblies 60, 60'. Tubular viscoelastic sheet 64 may be disposed between assemblies 60', 60". Sheets 62, 64 may be constructed from a plurality of materials including rubber composites.

Figure 111:
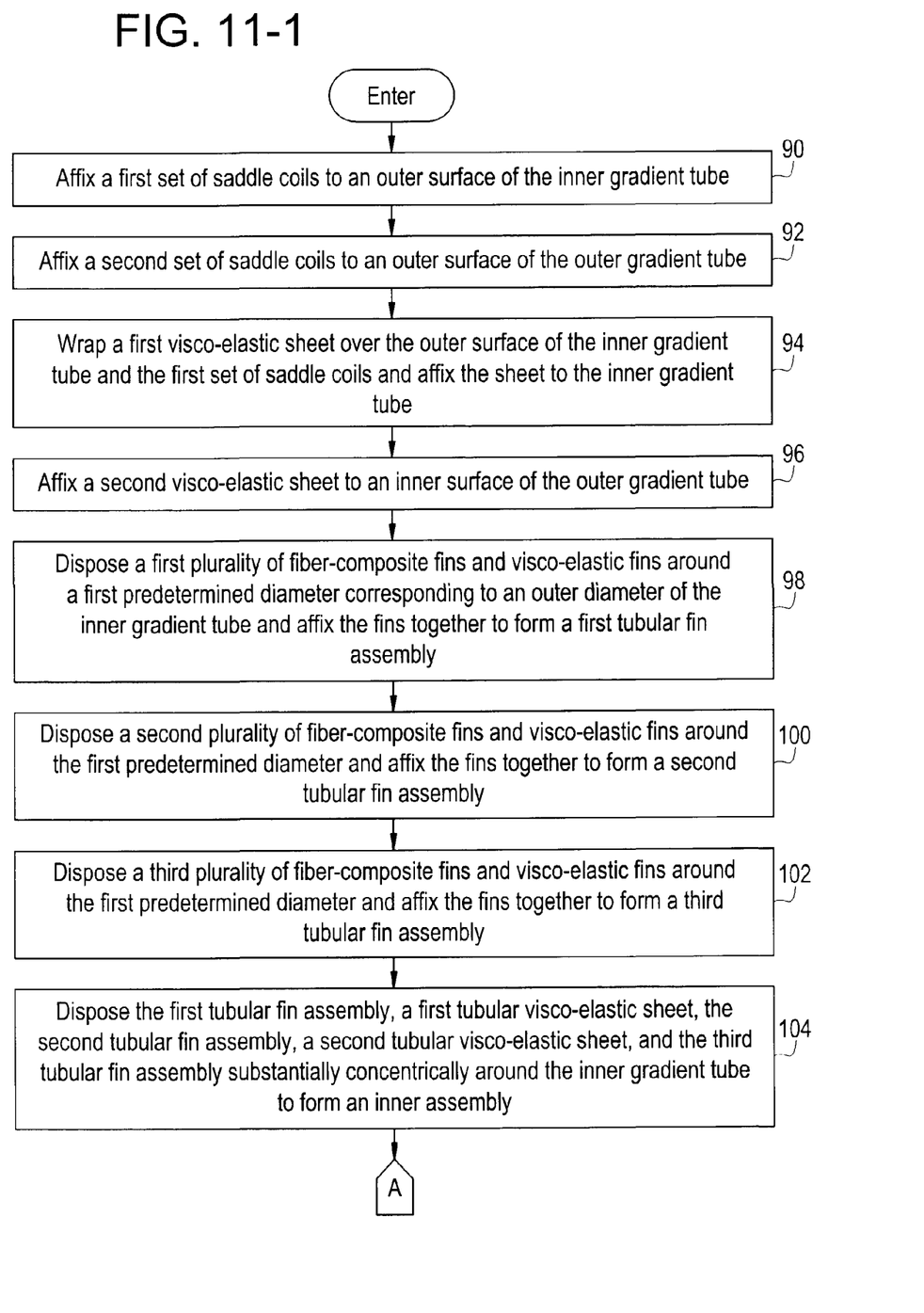
Figure 112:
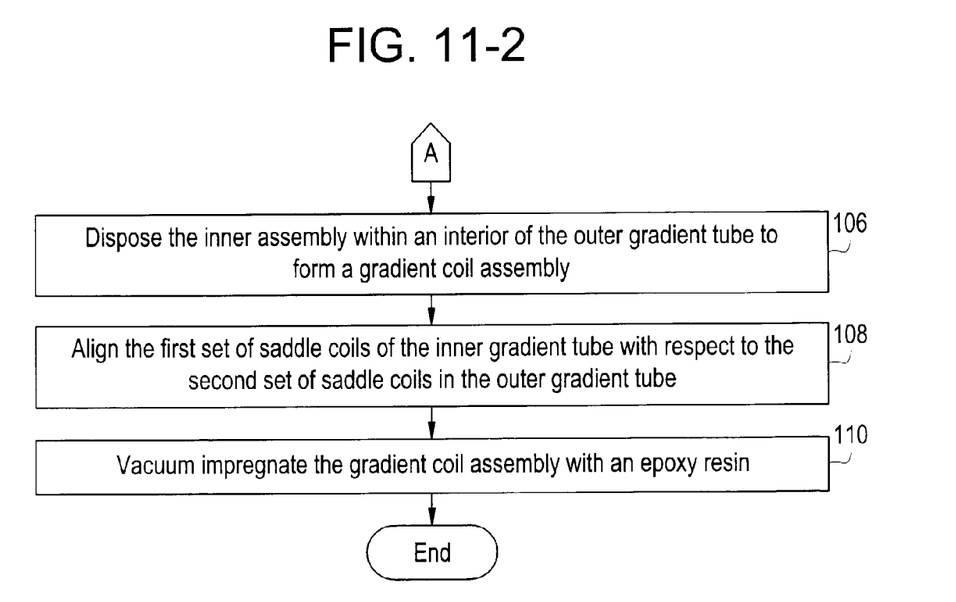

Referring to FIGS. 11-1 and 11-2, a method for assembling gradient coil assembly 22 will now be explained. At step 90, saddle coils 40, 42, 44, 46 of the (X) coil are affixed to an outer surface of inner gradient tube 30. It should be noted that inner (Y) coils (not shown) and inner (Z) coils (not shown) could also be disposed on inner gradient tube 30.

Next at step 92, saddle coils 32, 34, 36, 38 of the (X) coil are affixed to an outer surface of outer gradient tube 28. It should be noted that outer (Y) coils (not shown) and outer (Z) coils (not shown) could also be disposed on outer gradient tube 28.

Next at step 94, viscoelastic sheet 56 is wrapped over the outer surface of inner gradient tube 30 and saddle coils 40, 42, 44, 46, and sheet 56 is affixed to tube 30.

Next at step 96, viscoelastic sheet 58 is affixed to an inner surface of outer gradient tube 28.

Next at step 98, a first plurality of radially extending fiber composite fins 66 and viscoelastic fins 68 are disposed around a predetermined diameter (D) corresponding substantially to an outer diameter of inner gradient tube 30 plus a thickness of sheet 56. Further, the first plurality of fins 66, 68 are affixed together to form tubular fin assembly 60.

Next at step 100, a second plurality of radially extending fiber composite fins 66 and viscoelastic fins 68 are disposed around predetermined diameter (D). Further, the second plurality of fins 66, 68 are affixed together to form tubular fin assembly 60'.

Next at step 102, a third plurality of fiber composite fins 66 and viscoelastic fins 68 are disposed around predetermined diameter (D). Further, the third plurality of fins 66, 68 are affixed together to form tubular fin assembly 60".

Next at step 104, the tubular fin assembly 60, tubular viscoelastic sheet 62, tubular fin assembly 60', the viscoelastic sheet 64, and tubular fin assembly 60" are disposed substantially concentrically around inner gradient tube 30 to form an inner assembly 69.

Next at step 106, inner assembly 69 is disposed within an interior of outer gradient tube 28 to form gradient coil assembly 22.

Next at step 108, saddle coils 40, 42, 44, 46 of inner gradient tube 30 are aligned with respect to saddle coils 32, 34, 36, 38 of outer gradient tube 28.

Next at step 110, gradient coil assembly 22 is vacuum impregnated with epoxy resin (not shown).

Figure 8:
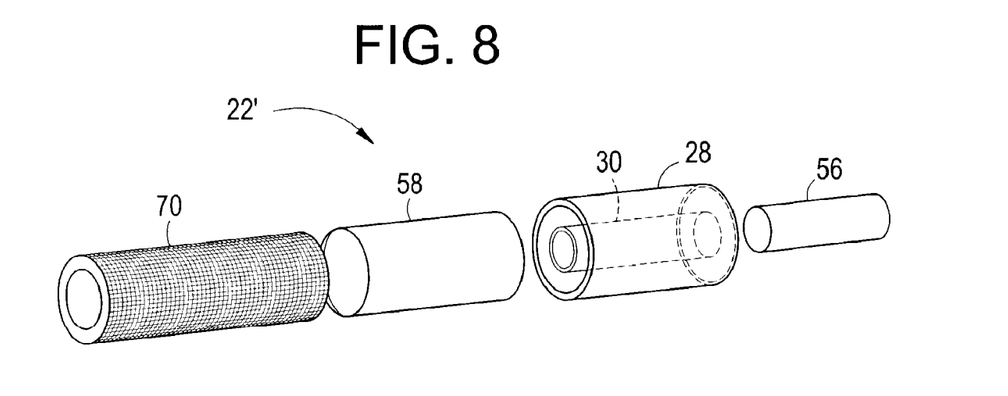
FIG. 8 is an exploded view of a second embodiment of a gradient coil assembly.

Referring to FIG. 8, an exploded view of a gradient coil assembly 22' in accordance with a second embodiment of the present invention is provided. Gradient coil assembly 22' may include outer gradient tube 28, inner gradient tube 30, viscoelastic sheet 56, viscoelastic sheet, and fiber composite tube 70. It should be noted that the primary difference between gradient coil assembly 22' in gradient coil assembly 22 is that assembly 22' utilizes a fiber composite tube 70 instead of tubular fin assemblies 60, 60', and 60".

Because the structure of outer gradient tube 28, inner gradient tube 30, viscoelastic sheet 56, and viscoelastic sheet 58 were discussed above with respect to gradient coil assembly 22, the structure of these components will not be discussed in any further detail below.

Figure 9:
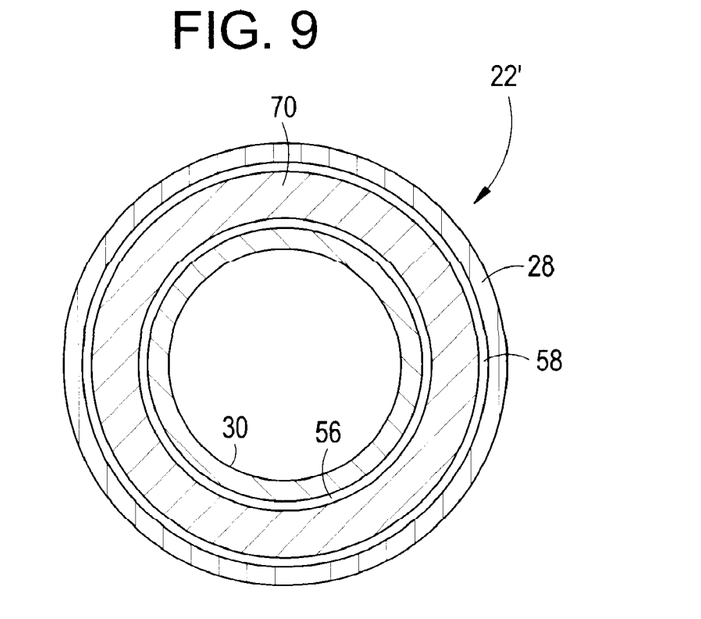
FIG. 9 is a cross-sectional view of the second embodiment of a gradient coil assembly.
Figure 10:
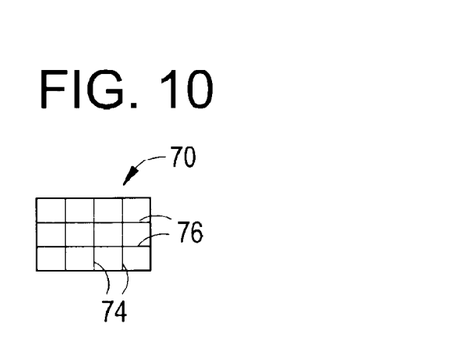
FIG. 10 is a schematic of a portion of a fiber composite tube used in the second embodiment of a gradient coil assembly.

Fiber composite tube 70 is provided to increase the stiffness of assembly 22' to prevent deformation of assembly 22' during energization of the saddle coils of assembly 22'. Fiber composite tube 70 may be constructed from a fiber composite material comprising one or more layers wherein each layer comprises a plurality of fibers such as glass fibers, carbon fibers, Kevlar fibers, and aluminum oxide fibers, for example, coated with the epoxy resin. Further, the fiber to resin ratio in the tube 70 may be equal to or greater than 90%. Further, referring to FIG. 10, a first plurality of fibers 74 being disposed substantially perpendicular to a second plurality of fibers 76 in tube 70 in the illustrated embodiment. It should be noted, however, that the orientation of the first plurality of fibers 74 with respect to the second plurality of fibers 76 may vary depending upon the desired operational characteristics of tube 70. Further, the ratio of fibers 74 with respect to fibers 76 may vary depending upon the desired operational characteristics of tube 70.

Figure 12:
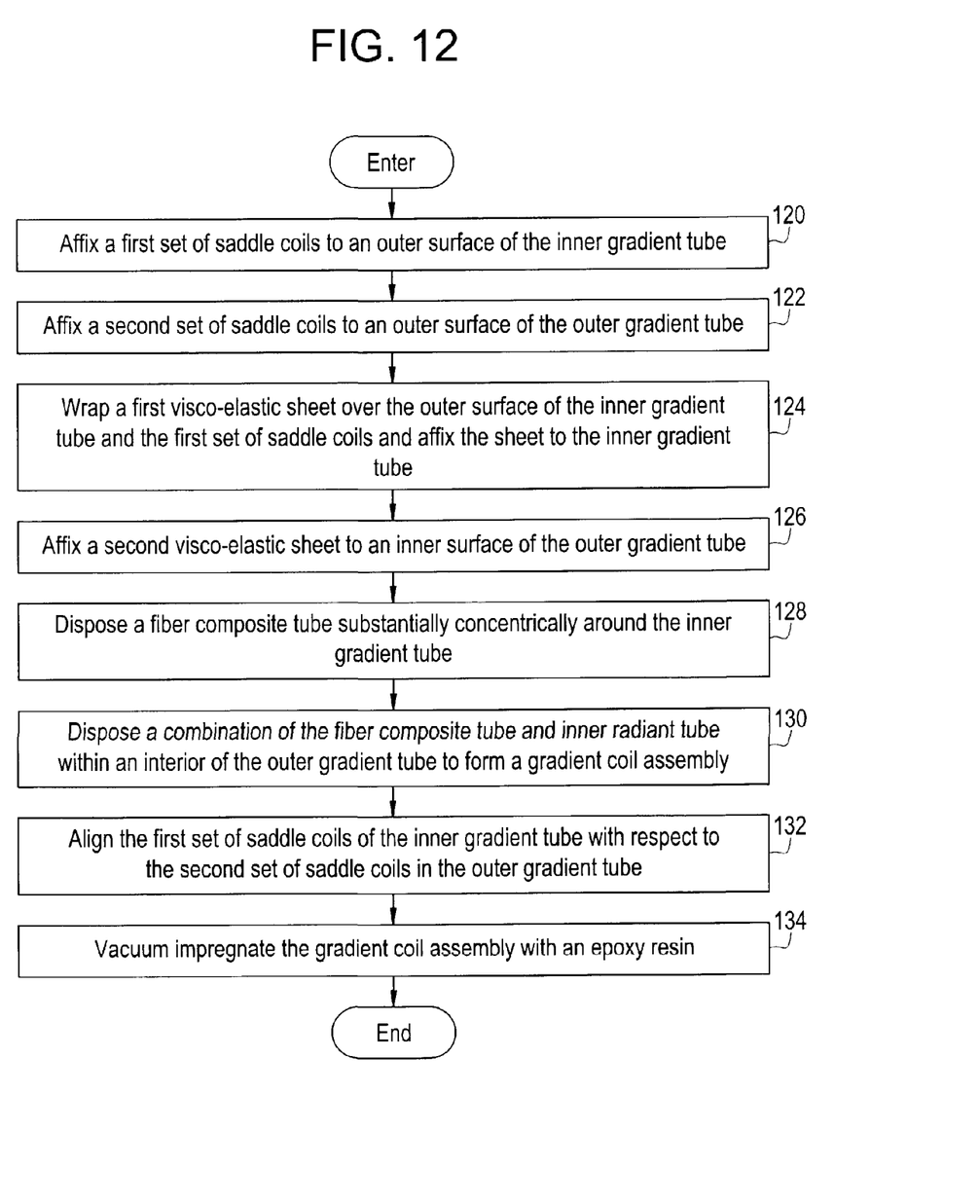
FIG. 12 is a flowchart of a method of assembling the second embodiment of the gradient coil assembly

Referring to FIG. 12, a method for assembling gradient coil assembly 22' will now be explained. At step 120, saddle coils 40, 42, 44, 46 of the (X) coil are affixed to an outer surface of inner gradient tube 30. It should be noted that inner (Y) coils (not shown) and inner (Z) coils (not shown) could also be disposed on inner gradient tube 30.

Next at step 122, saddle coils 32, 34, 36, 38 of the (X) coil are fixed to an outer surface of outer gradient tube 28. It should be noted that outer (Y) coils (not shown) and outer (Z) coils (not shown) could also be disposed on outer gradient tube 28.

Next at step 124, viscoelastic sheet 56 is wrapped over both an outer surface of inner gradient tube 30 and saddle coils 40, 42, 44, 46 and is affixed to tube 30.

Next at step 126, viscoelastic sheet 58 is affixed to an inner surface of outer gradient tube 28.

Next at step 128, fiber composite tube 70 is disposed substantially concentrically around inner gradient tube 30.

Next at step 130, a combination of fiber composite tube 70 and inner gradient tube 30 is disposed within an interior of outer gradient tube 28 to form gradient coil assembly 22'.

Next at step 132, saddle coils 40, 42, 44, 46 of inner gradient tube 30 are aligned with respect to saddle coils 32, 34, 36, 38 of outer gradient tube 28.

Next at step 134, gradient coil assembly 22' is vacuum impregnated with epoxy resin (not shown).

The inventive gradient coil assembly and method for manufacturing the assembly provide substantial advantages over other assemblies and methods. In particular, the inventive gradient coil assembly utilizes a fiber composite structure disposed between the inner and outer gradient tubes to provide a stiffer assembly as compared to other gradient coil assemblies. In particular, the fiber composite structure utilized in the inventive gradient coil assembly does not become elastic during relatively high operating temperatures of assembly 14 which provides a stiffer assembly as compared to other assemblies which utilize epoxy resin between the inner and outer gradient tubes. As a result, the stiffer inventive gradient coil assembly results in decreased noise being generated during energization of the saddle coils as compared to other systems. Still further, the inventive gradient coil assembly may utilize viscoelastic members optimally disposed within the assembly to further dampen vibrations and noise that occur during energization of the saddle coils in the gradient coil assembly.

While the invention is described with reference to exemplary embodiments, it will be understood by those skilled in the art that various changes may be made an equivalence may be substituted for elements thereof without departing from the scope of the invention. In addition, many modifications may be made to the teachings of the invention to adapt to a particular situation without departing from the scope thereof. Therefore, is intended that the invention not be limited the embodiments disclosed for carrying out this invention, but that the invention includes all embodiments falling with the scope of the intended claims. Moreover, the use of the term's first, second, etc. does not denote any order of importance, but rather the term's first, second, etc. are us are used to distinguish one element from another.

What is claimed is:

1. A gradient coil assembly for use in an MRI device, comprising:
   a first tube extending along an axis including a first conductor;
   a second tube disposed generally concentrically about the first tube wherein an inner space is defined between the first and second tubes, the second tube including a second conductor; and,
   a fiber composite structure disposed in the inner space operatively associated with the first and second tubes to increase a stiffness of the assembly.

2. The gradient coil assembly of claim 1 wherein the fiber composite structure is constructed from a resin and fibers disposed in the resin.

3. The gradient coil assembly of claim 2 wherein the fiber composite structure has a fiber to resin ratio equal to or greater than 90%.

4. The gradient coil assembly of claim 2 wherein the fibers comprise one of glass fibers, carbon fibers, Kevlar fibers, and aluminum oxide fibers, or a combination of fibers comprising at least one of the foregoing fibers.

5. The gradient coil assembly of claim 2 wherein the resin comprises an epoxy resin.

6. The gradient coil assembly of claim 2 wherein a temperature of the resin where the resin becomes non-elastic is greater than an operating temperature of the coil assembly.

7. The gradient coil assembly of claim 1 wherein the fiber composite structure comprises a plurality of radially extending fins.

8. The gradient coil assembly of claim 7 wherein spaces between each of the plurality of radially extending fins in the inner space is filled with resin.

9. The gradient coil assembly of claim 1 wherein the plurality of radially extending fins extend substantially from the first tube to the second tube.

10. The gradient coil assembly of claim 1 further comprising at least one viscoelastic member disposed in the inner space to dampen vibrations in the assembly.

11. The gradient coil assembly of claim 1 wherein the first conductor is disposed on an exterior surface of the first tube.

12. The gradient coil assembly of claim 1 wherein the second conductor is disposed on an exterior surface of the second tube.

13. A gradient coil assembly, comprising:
    a first tube extending along an axis including a first conductor;

a second tube disposed generally concentrically about the first tube wherein an inner space is defined between the first and second tube, the second tube including a second conductor; and, a fiber composite structure having resin and fibers disposed in the resin, the structure having a plurality of radially extending fins being disposed in the inner space to increase a stiffness of the assembly.

14. The gradient coil assembly of claim 13 wherein the fiber composite structure has a fiber to resin ratio equal to or greater than 90%.

15. The gradient coil assembly of claim 13 wherein the fibers comprise one of glass fibers, carbon fibers, Kevlar fibers, and aluminum oxide fibers, or a combination of fibers comprising at least one of the foregoing fibers.

16. The gradient coil assembly of claim 13 wherein the resin comprises an epoxy resin.

17. The gradient coil assembly of claim 13 wherein a temperature of the resin where the resin becomes non-elastic is greater than an operating temperature of the coil assembly.

18. The gradient coil assembly of claim 13 wherein spaces between each of the plurality of radially extending fins in the inner space is filled with resin.

19. The gradient coil assembly of claim 13 wherein the plurality of radially extending fins extending substantially from the first tube to the second tube.

20. The gradient coil assembly of claim 13 further comprising at least one viscoelastic member disposed in the inner space to dampen vibrations in the assembly.

21. A method for assembling a gradient coil assembly for use in an MRI device, comprising:

disposing a first gradient tube generally concentrically about a second gradient tube wherein an inner space is defined between the first and second gradient tubes; and, disposing a fiber composite structure in the inner space defined by the first and second gradient tubes.

* * * * *

UNITED STATES PATENT AND TRADEMARK OFFICE
CERTIFICATE OF CORRECTION

PATENT NO.    : 6,940,281 B2
DATED         : September 6, 2005
INVENTOR(S)   : Peter Feenan et al.

It is certified that error appears in the above-identified patent and that said Letters Patent is hereby corrected as shown below:

Column 3,
Line 1, after "As" delete "shown tube 30," and insert -- shown, tube 30 --.
Line 32, after "now" insert -- be --.

Column 4,
Line 58, after "sheet" (second occurrence) insert -- 58 --.

Column 5,
Line 12, after "70" insert -- is shown --.

Column 6,
Line 5, after "made" insert -- and --.
Line 15, after "etc." delete "are us".

Signed and Sealed this

Twenty-fourth Day of January, 2006

JON W. DUDAS
*Director of the United States Patent and Trademark Office*